US005161301A

United States Patent [19]

Kilsdonk

[11] Patent Number: 5,161,301

[45] Date of Patent: Nov. 10, 1992

[54] DOUBLE-BARRELLED CONTACT TOOL AND METHOD OF USING SAME

[75] Inventor: Jan A. Kilsdonk, Corona, Calif.

[73] Assignee: McDonnell Douglas Corporation, Long Beach, Calif.

[21] Appl. No.: 723,829

[22] Filed: Jul. 1, 1991

[51] Int. Cl.[5] .................... H05K 3/30

[52] U.S. Cl. .................... 29/739; 29/764

[58] Field of Search .................... 29/739, 741, 764, 743

[56] References Cited

U.S. PATENT DOCUMENTS

| | | | |
|---|---|---|---|
| 2,960,864 | 11/1960 | Watts | 73/141 |
| 2,962,807 | 12/1960 | Hammell | 29/254 |
| 2,976,608 | 3/1961 | Busler | 29/254 |
| 3,110,093 | 11/1963 | Johnson | 29/203 |
| 3,135,147 | 6/1964 | Curtis et al. | 81/52.35 |
| 3,896,535 | 7/1975 | Tucci | 29/206 |
| 4,006,961 | 2/1977 | Langenbach | 339/217 |
| 4,070,755 | 1/1978 | Carter | 29/764 |
| 4,168,569 | 9/1979 | Fairbairn | 29/764 |
| 4,387,943 | 6/1983 | Werth et al. | 339/59 |
| 4,414,736 | 11/1983 | Fieberg et al. | 29/747 |
| 4,494,305 | 1/1985 | Safai | 29/764 |
| 4,639,061 | 1/1987 | Muzslay | 339/59 |
| 4,762,354 | 8/1988 | Gfeller et al. | 29/743 X |

*Primary Examiner*—Carl E. Hall

*Attorney, Agent, or Firm*—Donald E. Stout; Gregory A. Cone; John P. Scholl

[57] ABSTRACT

A double-barreled tool for inserting and extracting electrical contacts includes an inner barrel and an outer barrel, the inner barrel being coaxial with the outer barrel and fully retractable therein. Each barrel has an elongated slot which are in alignment with one another. A means is provided for retracting the inner barrel into and extending the inner barrel from one end of the outer barrel. The contacts have lead wires extending therefrom. To extract and electrical contact from its installed position within an insulator body cavity, the contact lead wire is first slipped into the aligned slots of the inner and outer barrels. Then, the tool is guided along the wire and into the cavity, until the outer barrel impacts the dielectric within the cavity at a point at which the cavity narrows. At this juncture, the inner barrel is extended from the other barrel such that the end of the inner barrel approaches the electrical contact, thereby releasing the contact. Once the contact is released, the wire and tool are gripped together and pulled simultaneously from the cavity, thereby extracting the contact from the cavity. Finally, the wire is released from the tool.

10 Claims, 2 Drawing Sheets

FIG. 1.
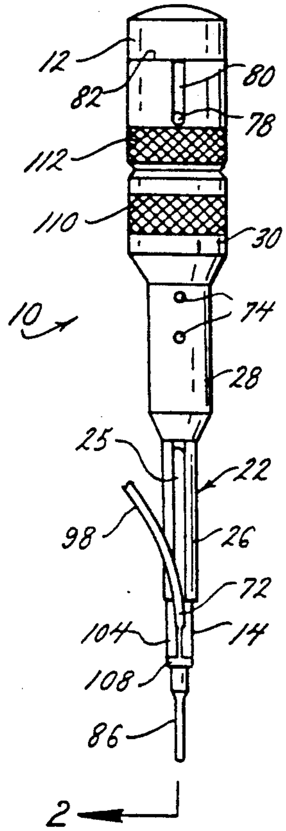
FIG. 2.
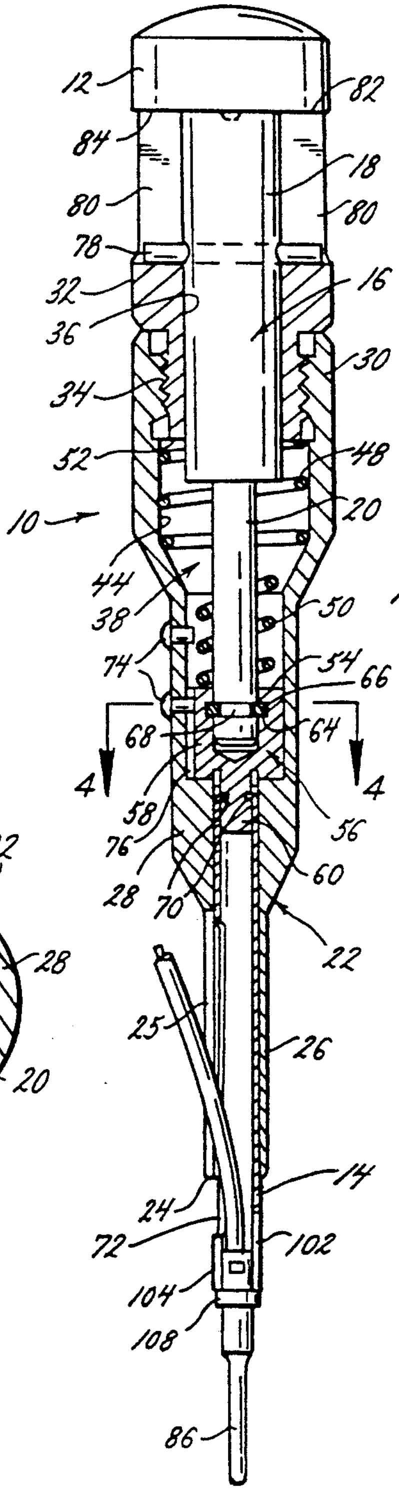
FIG. 3.
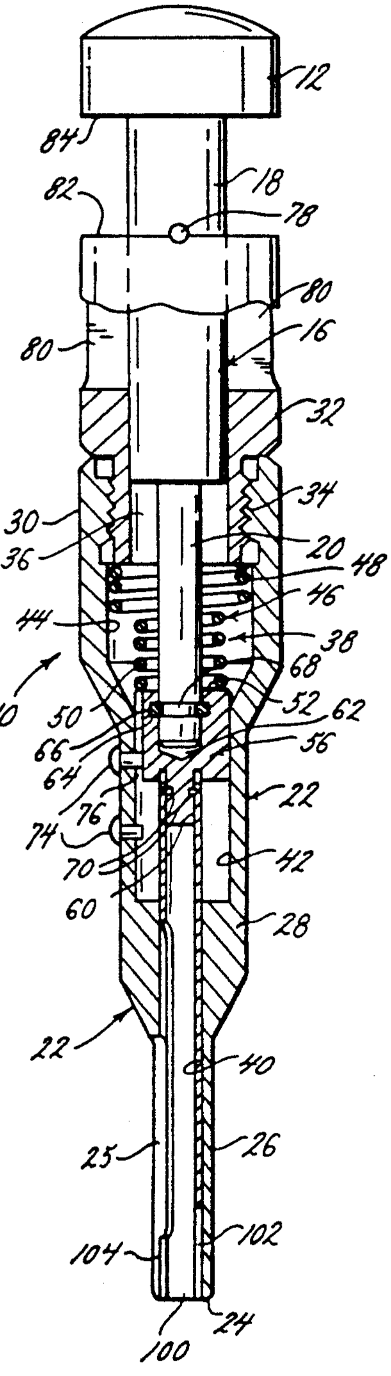
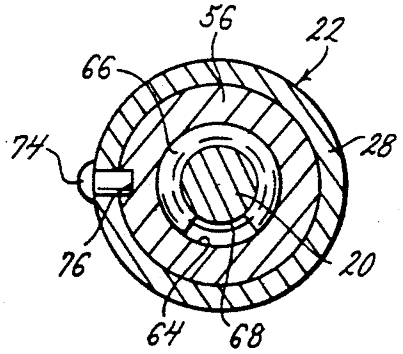
FIG. 4.

FIG. 8.
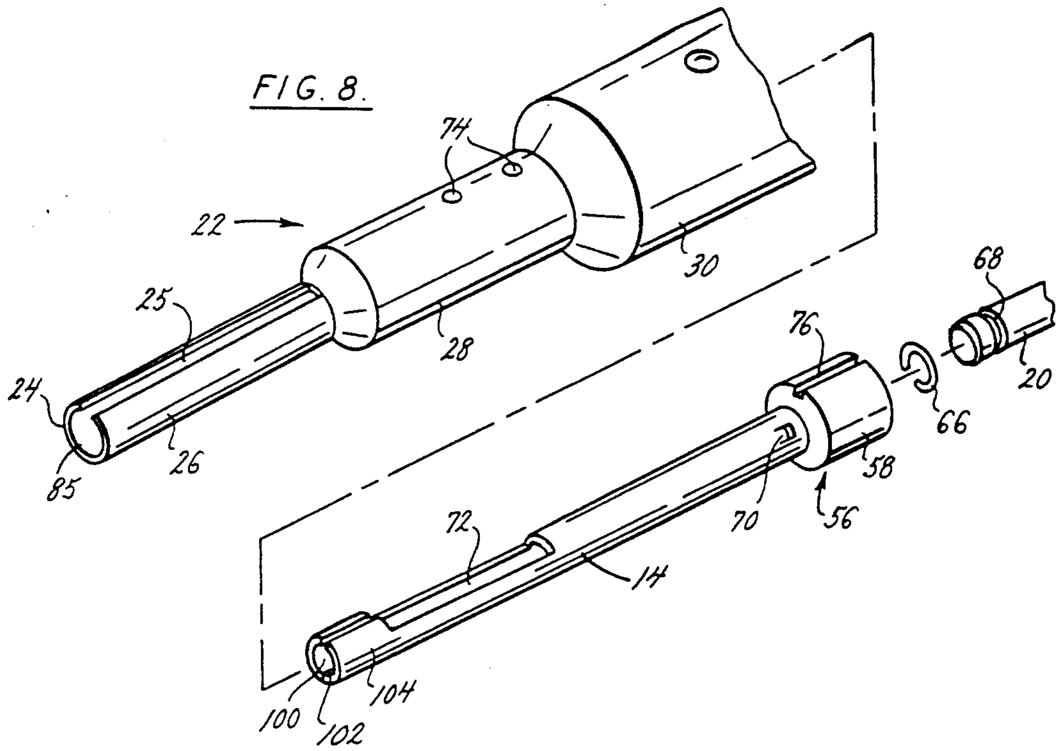
FIG. 6.
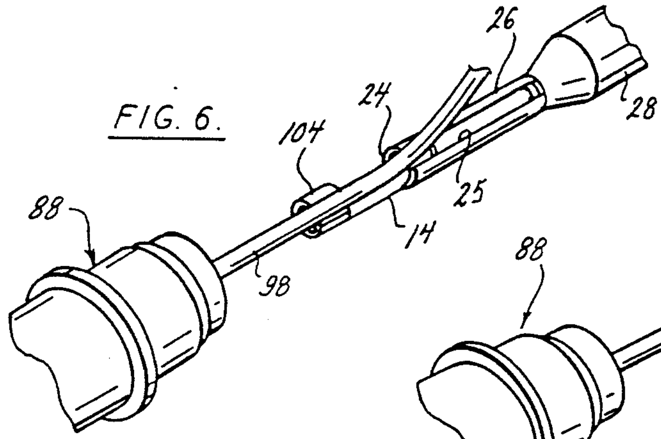
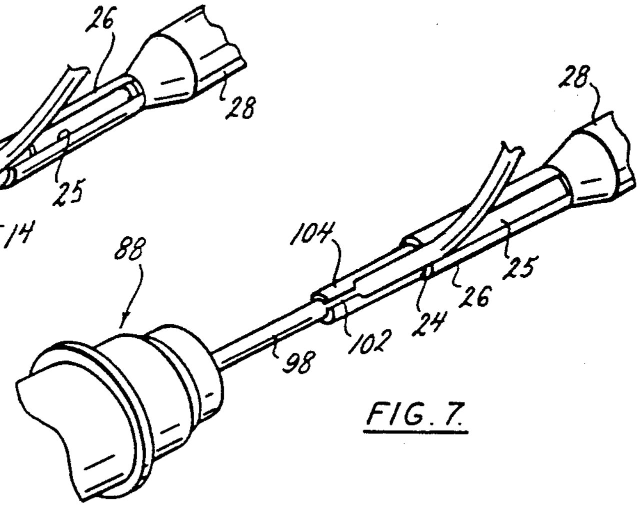
FIG. 7.
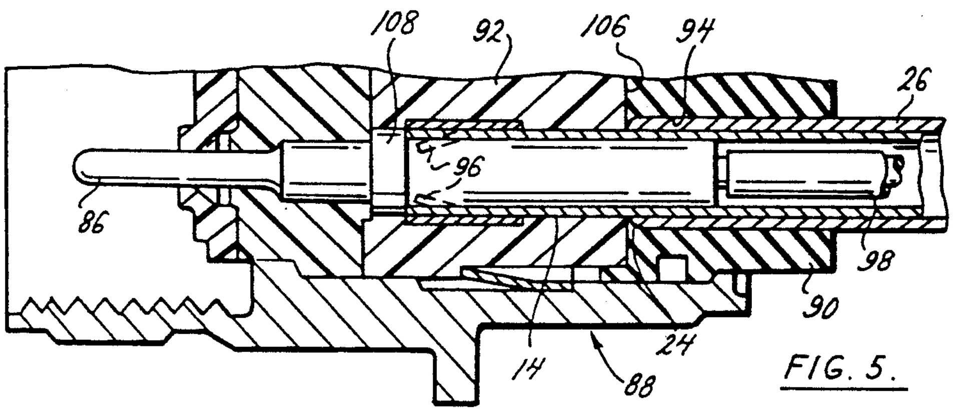
FIG. 5.

DOUBLE-BARRELLED CONTACT TOOL AND METHOD OF USING SAME

BACKGROUND OF THE INVENTION

This invention relates to tools, and more particularly to a double barreled tool suitable for extracting and inserting electrical contacts from and into an insulation body.

In certain industries such as the aircraft and automotive industries, electrical connectors of the type wherein one or more contact terminals are mounted in an insulation body are commonly employed. Such a connector is typically of the rear insertion and rear release configuration and consists of a dielectric within which are a plurality of plug-in connector terminals. In more recent years, an elastomeric environmental protection grommet, typically made of rubber, has been added to the connector in order to reduce the chance of moisture penetrating the insulator cavity. Smaller contacts and denser cavity layouts, in combination with the addition of the aforementioned grommet, have exacerbated a problem which has long plagued the industry regarding effective and efficient methods and tools for inserting and removing these electrical contacts in the field.

The current state of the art tool employed in the industry is of the type disclosed in U.S. Pat. No. 3,110,093, to G.S. Johnson. This type of tool generally has a plastic body serving as a handle and a tube which has a longitudinal slot. In use, the contact lead wire is slipped into the tube through the slot so that the tool may be guided along the wire into the insulator cavity in order to remove the contact. The tube may be either plastic or metal. In practice, metallic tubes are quite durable, but their sharp tips tend to damage the grommet and the dielectric, resulting in an unacceptably high connector rejection rate.

Because of the potential for connector damage, these metal tool tips are not permitted by the military services in defense-related work. Tools having plastic tubes, on the other hand, are very fragile. The nature of the connector requires that the tube walls be very thin. If more glass is added to the material for greater rigidity, the tube tends to be very brittle. If, conversely, less glass is used, the tip tends to be so soft that it squashes or overlaps upon itself, rendering it useless for performing its intended task. The upshot of all this is that the currently used tool tends to be all plastic, inexpensive, and disposable, but will in fact not withstand a reasonable cycle. Typically, only one to three extractions/insertions may be expected per tool, resulting in operator frustration, low productivity, and high cost. What is needed, then, is a simple, durable, relatively inexpensive tool for extracting/inserting electrical contacts which is easy to use and which does not damage the connector.

SUMMARY OF THE INVENTION

This invention solves the problem outlined above by providing a simple and durable tool for inserting or extracting an electrical contact which is easy to use and minimizes the problem of damage to the connector. The tool includes a generally cylindrical outer barrel having a first slot thereon. A generally cylindrical inner barrel having a second slot thereon is coaxial with the outer barrel and is fully retractable therein. The first and second slots are in alignment. A means is provided for retracting the inner barrel into and extending it from a first end of the outer barrel. An upper body member is detachably connected to a second end of the outer barrel.

The means for retracting and extending the inner barrel includes a rotatable knob, which is attached to a first end of a shaft. A first bore extends through the upper body member and a second bore extends through the outer barrel, such that the two bores are aligned lengthwise along the tool when the upper body member and the outer barrel are assembled together. The shaft extends through the first and second bores and the inner barrel is attached to a second end of the shaft. Thus, the knob is positioned adjacent to a second end of the upper body member, such that when it is rotated, the inner barrel can be either retracted or extended.

In another aspect of the invention, a method of using the above-described tool to remove an electrical contact from an insulation body is disclosed. The contact has a lead wire attached thereto, while the insulation body has a grommet and a dielectric arranged adjacent to one another. A stepped cavity extends lengthwise through the grommet and the dielectric wherein a portion of the dielectric protrudes into the cavity, making the cavity's cross-sectional area through the dielectric narrower than its cross-sectional area through the grommet. The method involves the steps of slipping the contact lead wire into the aligned first and second slots and guiding the tool along the wire and into the cavity, inserting it thereinto until the end of the outer barrel contacts the dielectric protruding portion. Then, the inner barrel is extended from the outer barrel such that the end of the inner barrel approaches the electrical contact, thereby releasing the contact. Once the contact is released, the wire and tool are gripped together and pulled simultaneously from the cavity, thereby extracting the contact from the cavity. Finally, the wire is released from the tool.

The above mentioned and other objects and features of this invention and the manner of attaining them will become apparent, and the invention itself will be best understood, by reference to the following description taken in conjunction with the accompanying illustrative drawings.

BRIEF DESCRIPTION OF THE DRAWINGS

FIG. 1 is a plan view showing the double-barreled contact tool of the invention gripping an electrical contact;

FIG. 2 is a cross-sectional view taken along line 2—2 of FIG. 1, showing the tool with the inner barrel in an extended position;

FIG. 3 is a cross-sectional view similar to FIG. 2, showing the tool with the inner barrel in a retracted position;

FIG. 4 is a cross-sectional view taken along lines 4—4 of FIG. 2, showing constructional details of the tool;

FIG. 5 is a cross-sectional view showing the double-barreled contact tool being inserted into an insulator cavity to remove a contact therefrom;

FIG. 6 is a perspective view showing the tool, with its inner barrel in the extended position and spread apart for insertion of the lead wire from the insulator cavity;

FIG. 7 is a perspective view similar to FIG. 6, showing the tool with its inner barrel in the extended position and the lead wire fully inserted, such that the lead wire serves as a guide for the tool; and FIG. 8 is an exploded perspective view showing the construction of the two barrels of the tool.

DETAILED DESCRIPTION OF THE DRAWINGS

Referring now to the drawings, FIGS. 1-4 and 8 show a double-barreled contact tool of the invention, generally designated as 10. The tool includes a rotatable knob 12, which is attached to an inner barrel 14 through an elongated shaft 16. Shaft 16 includes a large diameter proximal portion 18 extending from knob 12, and a small diameter distal portion 20 extending from the inner barrel 14. An outer barrel, generally designated as 22, is coaxial with and surrounds the inner barrel 14, and includes a rounded tip 24 at its distal end, as well as an elongated slot 25. The outer barrel 22 comprises three stepped portions, consisting of a first narrow diameter portion 26, a second intermediate diameter portion 28, and a third large diameter portion 30. An upper body member 32 is attached to the proximal end of the third portion 30 of the outer barrel 22 by means of a threaded connection 34.

Now viewing FIGS. 2, 3, 4, and 8, it may be seen that shaft 16 extends through bore 36 in the upper body member 32 and bore 38 in the outer barrel 22. Bore 38 is comprised of three sections; first reduced diameter bore section 40, second intermediate diameter bore section 42, and third large diameter bore section 44, which generally correspond with the three portions 26, 28, and 30 of the outer barrel 22. Housed within the bore 38 is a coil spring 46, which may be of any known type. Coil spring 46 is biased between a lower surface 52 of the upper body member 32, and an upper surface 54 of a two-way adapter 56, with its upper portion 48 contacting the surface 52 and its lower portion 50 contacting the surface 54. Adapter 56 is generally cylindrical, having a larger diameter cylindrical segment 58 at its proximal end and a smaller diameter cylindrical segment 60 at its distal end. The segment 58 has a center bore 62, which is open to the bore section 44 at the surface 54. The inner surface of the cylindrical segment 58 includes a groove 64, which is accessible to and surrounds the center bore 62. Permanently inserted within the groove 64 is a generally semicircular adapter clip 66 (most clearly seen in FIG. 8). The adapter 56 is attached to the shaft 20 by inserting the proximal end of the shaft 20 into the adapter bore 62 until the adapter clip 66 snaps into a groove 68 on the shaft. To attach inner barrel 14 to the adapter 56, the inner barrel 14 is fitted over the smaller diameter cylindrical segment 60 until retainer tangs 70 on the barrel 14 snap into cutouts in the segment 60 (not shown).

The inner barrel 14 has an elongated slot 72 which is in alignment with the slot 25 on the outer barrel 22 when the tool is assembled. This alignment is always maintained by virtue of a pair of alignment pins 74, which protrude from the inner surface of the outer barrel 22 and engage a groove 76 in the adapter 56 attached to the inner barrel 14, thereby ensuring that there will be no relative rotational movement between the outer and inner barrels as the inner barrel 14 is extended and retracted with respect to the outer barrel 22. This extension and retraction motion of the inner barrel 14 is effected by rotation of the knob 12, on which is a pin 78. The upper body member 32 has an elongated slot 80 thereon, which is open to an upper surface 82 of the upper body member 32. To retract the inner barrel 14, the knob 12 is positioned so that the pin 78 rests on the surface 82 of the upper body member 32. In this position, the spring 46 is compressed and the inner barrel 14 is housed completely within the outer barrel 22. A lower surface 84 on the knob 12 is spaced upwardly away from the upper surface 82 of the upper body member 32. To extend the inner barrel 14 out of a lower end 85 of the outer barrel 22, the knob 12 is rotated so that the pin 78 is guided into the slot 80. This motion permits the spring 46 to expand/relax, pushing the inner barrel into an extended position and pulling the knob 12 downwardly toward the upper body member 32 until the surface 82 is flush with the surface 84.

FIGS. 5-7 show the tool 10 in use to extract an electrical contact 86 from an insulation body 88, or conversely to insert the contact 86 into the body 88. A typical insulation body 88 comprises an environmental protection grommet 90 and a dielectric 92, within both of which extends a cavity 94. The cavity 94 is stepped, in that its cross-sectional area is larger along the length of the grommet 90 than along the length of the dielectric 92. In its installed position, the contact 86 is inserted within the cavity 94 as shown in FIG. 5, and is retained in position by a pair of retainer tangs 96, which extend into the cavity 94 to prevent egress of the contact 86 therefrom. A contact lead wire 98 extends outwardly from the cavity 94 as shown in FIGS. 6 and 7.

To extract the contact 86, the inner barrel 14 is released to its extended position, as described above, by rotation of the knob 12 to permit the pin 78 to be guided into slot 80, thereby expanding the spring 46. The contact lead wire 98 is then slipped sideways into the slot 72, or alternatively may be fed through the end 100 of the barrel 14. Threading of the wire 98 into the inner barrel 14 is facilitated by the slot 72, which extends to the end 100 of the barrel 14, and by a slit 102 in the end segment 104 of the barrel 14 (shown in FIG. 8) and opposed to the slot 72, which together permit the end 100 of the barrel 14 to be spread apart by the action of forcing the wire into the slot 72. Once the wire 98 has been fed into the inner barrel 14 (see FIG. 7), the barrel 14 is retracted into the outer barrel 22, by upwardly pulling the knob 12 until the pin 78 is disengaged from the slot 80, and then rotating the knob 12 approximately 90 degrees in either direction so that the pin 78 rests on the upper surface 82 of the upper body member 32. This action compresses the spring 46 as shaft 16 pulls the inner barrel 14 upwardly, as explained above. Once the barrel 14 has been retracted, the tool 10 is guided into the cavity 94 along the wire 98, entering the cavity 94 as shown in FIG. 5. The outer barrel 22, which has a smooth outer periphery to assure no cutting into the elastomeric grommet 90, is inserted into the cavity 94 until the rounded tips 24 bottom on the hard dielectric 92, at a surface 106. Surface 106 constitutes the point at which the cavity 94 steps down to a cross-sectional area sufficient to permit passage of the inner barrel 14 thereinto, but insufficient to allow entry of the outer barrel 22. Rounded tips 24 present a blunt edge to the surface 106, prevent cutting thereof.

To release the contact 86 out of the cavity 94, the contact retainer tangs 96 must be pushed outwardly, in order to clear the contact shoulder 108. To do this, the inner barrel 14 is again extended, in the manner described above, so that it may extend farther into the cavity 94 to engage the contact shoulder 108, thereby pushing the retainer tangs 96 outwardly as required. At this point, the wire 98 may be held against the upper body member 32 of the tool 10 by the tool operator, who then pulls the tool 10 and the wire 98 simultaneously out of the cavity 94, thereby extracting the contact 86 without difficulty. Once outside of the cavity 94, the wire 98 may be disengaged from the inner barrel 14 by pulling it through the end 100 thereof, at which time the tool 10 is again ready for use.

The tool may be used to insert a contact 86 into the insulation body 88 by substituting an inner barrel 14 which has an end 100 that is configured for insertion rather than extraction of a contact 86. The two configurations are essentially the same, except for slightly different dimensional considerations which are well known to those skilled in the art. The inner barrel 14 may be replaced in the field by the tool operator in an easy operation involving only the manipulation of retainer tangs 70 to permit release of the barrel 14 from the adapter 56. The new barrel 14 may then simply be snapped onto the adapter 56 using the same tangs 70. Then the contact 86 may be inserted by essentially following the same steps as outlined above. First, as when removing a contact, the contact lead wire 98 would be fed into the slot 72 of the tool inner barrel 14, after which the barrel 14 would be retracted into the outer barrel 22. The tool operator would then hold the wire 98 against the upper body member 32 of the tool 10 and would guide the tool into the cavity 94, until the outer barrel tips 24 bottomed against the surface 106. At this point, the inner barrel 14 would be extended until the contact 86 was in its installed position. Then, the tool 10 would be pulled outwardly from the cavity 94 along the lead wire 98, with the operator gripping only the tool and not the wire. Once the tool 10 is out of the cavity 94, it may be pulled sideways from the wire 98 or pulled along the wire until released from the end thereof.

Important additional features of the tool 10 are that it may be quickly disassembled by unscrewing the threaded connection 34, thereby separating the upper body member 32 from the outer barrel 22. To do this easily, knurled grip sections 110 and 112 are provided in member 32 and barrel 22 respectively. Also, the outer tool body can be used an an insertion or extraction tool for various contact gauges, for example 16, 20, and 22 gauge contacts, by exchanging different sized inner barrels. The inner and outer barrels 14 and 22, respectively, as well as the upper body member 32, are preferably metallic, but may also be made of other durable materials, such as plastic, if desired.

Although an exemplary embodiment of the invention has been shown and described, many changes, modifications, and substitutions may be made by one having ordinary skill in the art without departing from the spirit and scope of the invention. For example, different and various mechanisms may be employed for extending and retracting the inner barrel 14. Also, different means may be employed for securing the various elements of the tool to one another. Therefore, the scope of the invention is to be limited only in accordance with the following claims.

What is claimed is:

1. A tool for inserting or removing an electrical contact, comprising:

a generally cylindrical outer barrel having a first slot thereon;

a generally cylindrical inner barrel having a second slot thereon, said second slot being aligned with said first slot, said inner barrel being coaxial with said outer barrel and fully retractable therein;

an upper body member having a first end connected to a second end of said outer barrel; and a means for retracting said inner barrel into and extending said inner barrel from a first end of said outer barrel, said means for retracting and extending said inner barrel comprising:

a rotatable knob;

a shaft having a first end and a second end, said knob being attached to said first end and said inner barrel being attached to said second end;

a first bore extending through said upper body member; and a second bore extending through said outer barrel, such that said first and second bores are aligned lengthwise along the tool when said upper body member and said outer barrel are assembled together;

wherein said shaft extends through said first and second bores and said knob is positioned adjacent to a second end of said upper body member, such that when said knob is rotated, said inner barrel can be either retracted or extended.

2. The tool as recited in claim 1, wherein said retracting and extending means further comprises:

an elongated slot extending lengthwise along said upper body member downwardly from said second end thereof;

a pin extending laterally from said shaft a predetermined distance downwardly from said knob; and a spring means arranged within the outer barrel bore, said spring means being compressed when said inner barrel is in a retracted position and being expanded when said inner barrel is in an extended position;

whereby to extend said inner barrel, said knob is rotated until said pin is guided into said upper body member elongated slot, thereby expanding said spring and pushing said inner barrel downwardly out of said outer barrel.

3. The tool as recited in claim 1, wherein said inner barrel is detachably connected to said shaft second end, said inner barrel being interchangeable with differently sized inner barrels for inserting and extracting differently sized electrical contacts.

4. A tool for inserting or removing an electrical contact to or from an insulation body, said contact having a lead wire extending therefrom, said tool comprising:

a generally cylindrical outer barrel having a first slot thereon;

a generally cylindrical inner barrel having a second slot thereon, said second slot being aligned with said first slot, said inner barrel being coaxial with said outer barrel and fully retractable therein; and a means for retracting said inner barrel into and extending said inner barrel from a first end of said outer barrel;

wherein said contact lead wire may be slipped into said aligned inner and outer barrel slots such that said tool may be guided along said wire into or out of said insulation body.

5. The tool as recited in claim 4 and further comprising an upper body member, wherein a first end of said upper body member is detachably connected to a second end of said outer barrel.

6. The tool as recited in claim 5, wherein said means for retracting and extending said inner barrel comprises:

a rotatable knob;

a shaft having a first end and a second end, said knob being attached to said first end and said inner barrel being attached to said second end;

a first bore extending through said upper body member; and a second bore extending through said outer barrel, such that said first and second bores are aligned lengthwise along the tool when said upper body member and said outer barrel are assembled together;

wherein said shaft extends through said first and second bores and said knob is positioned adjacent to a second end of said upper body member, such that when said knob is rotated, said inner barrel can be either retracted or extended.

7. The tool as recited in claim 6, wherein said retracting and extending means further comprises:

an elongated slot extending lengthwise along said upper body member downwardly from said second end thereof;

a pin extending laterally from said shaft a predetermined distance downwardly from said knob; and a spring means arranged within the outer barrel bore, said spring means being compressed when said inner barrel is in a retracted position and being expanded when said inner barrel is in an extended position;

whereby to extend said inner barrel, said knob is rotated until said pin is guided into said upper body member elongated slot, thereby expanding said spring and pushing said inner barrel downwardly out of said outer barrel.

8. The tool as recited in claim 6, wherein said inner barrel is detachably connected to said shaft second end, said inner barrel being interchangeable with differently sized inner barrels for inserting and extracting differently sized electrical contacts.

9. The tool as recited in claim 4, wherein said inner barrel is removable from said outer barrel and interchangeable with differently sized inner barrels for inserting and extracting differently sized electrical contacts.

10. A method of using a tool to remove an electrical contact from an insulation body, said electrical contact having a lead wire attached thereto, said insulation body having a grommet and a dielectric arranged adjacent to one another, a stepped cavity extending lengthwise through said grommet and said dielectric wherein a portion of said dielectric protrudes into said cavity such that the cavity through said dielectric is narrower in cross-section than the cavity through said grommet; said tool comprising an outer barrel having a first slot thereon, and an inner barrel having a second slot thereon, wherein said first and second slots are in general alignment, said tool further comprising a means for retracting said inner barrel into and extending said inner barrel out of an end of said outer barrel; said method comprising the steps of:

a) slipping said lead wire into said aligned first and second slots;

b) guiding said tool along said wire and inserting it into said cavity until the end of said outer barrel contacts said electric protruding portion;

c) extending said inner barrel from said outer barrel so that the end of said inner barrel touches said electrical contact, thereby releasing said contact;

d) gripping said wire and said tool together and pulling them simultaneously from said cavity, thereby extracting said contact from said cavity; and e) releasing said wire from said tool.

* * * * *